United States Patent
Brandt et al.

(10) Patent No.: US 9,468,131 B2
(45) Date of Patent: Oct. 11, 2016

(54) MONOLITHIC MULTI-MODULE ELECTRONICS CHASSIS WITH MULTI-PLANAR EMBEDDED FLUID COOLING CHANNELS

(71) Applicant: Raytheon Company, Waltham, MA (US)

(72) Inventors: David B. Brandt, Garland, TX (US); Robert K. Dodds, Redondo Beach, CA (US); David W. Chu, Redondo Beach, CA (US); Alicia G. Allen, Plano, TX (US); Gregory P. Schaefer, McKinney, TX (US)

(73) Assignee: Raytheon Company, Waltham, MA (US)

(*) Notice: Subject to any disclaimer, the term of this patent is extended or adjusted under 35 U.S.C. 154(b) by 111 days.

(21) Appl. No.: 14/254,518

(22) Filed: Apr. 16, 2014

(65) Prior Publication Data

US 2015/0305198 A1    Oct. 22, 2015

(51) Int. Cl.
*H05K 7/20* (2006.01)
*H05K 13/00* (2006.01)

(52) U.S. Cl.
CPC ...... *H05K 7/20218* (2013.01); *H05K 7/20254* (2013.01); *H05K 7/20636* (2013.01); *H05K 13/00* (2013.01)

(58) Field of Classification Search
CPC .............. H01L 23/473; H01L 23/427; H05K 7/20772; H05K 7/2079; H05K 7/20781; H05K 7/20836; H05K 7/20254; H05K 7/20809; H05K 7/20272; H05K 7/20509; G06F 1/20

USPC ....... 165/80.1–80.5, 104.19, 104.28–104.31; 361/679.46, 679.53, 698–703

See application file for complete search history.

(56) References Cited

U.S. PATENT DOCUMENTS

| 4,814,030 A | * | 3/1989 | Dubuisson | ............ H01L 23/467 |
| | | | | 156/155 |
| 4,867,235 A | * | 9/1989 | Grapes | ................ H01L 23/3733 |
| | | | | 165/185 |
| 4,962,444 A | * | 10/1990 | Niggemann | ....... H05K 7/20645 |
| | | | | 165/80.4 |
| 5,395,499 A | | 3/1995 | Matyi et al. | |

(Continued)

FOREIGN PATENT DOCUMENTS

| CA | 2810065 A1 | 3/2012 |
| DE | 10-2011-101302 A1 | 11/2012 |

(Continued)

OTHER PUBLICATIONS

International Search Report dated Nov. 1, 2013 in connection with International Patent Application No. PCT/US2013/030234; 2 pages.

(Continued)

*Primary Examiner* — Adam B Dravininkas

(57) ABSTRACT

A cooling system for cooling a heat source includes a monolithic structure having a plurality of embedded cooling channels arranged in a multi-planar arrangement, the embedded cooling channels configured to carry a cooling fluid to a plurality of locations throughout the monolithic structure, the cooling fluid configured to absorb heat transferred from a heat source associated with the monolithic structure. The monolithic structure is formed integrally with the embedded cooling channels using an additive manufacturing process.

21 Claims, 7 Drawing Sheets

(56) References Cited

U.S. PATENT DOCUMENTS

| | | | |
|---|---|---|---|
| 6,169,247 | B1 | 1/2001 | Craft, Jr. et al. |
| 6,989,991 | B2* | 1/2006 | Barson .................. H01L 23/473 |
| | | | 165/80.4 |
| 7,187,550 | B1 | 3/2007 | Heydari et al. |
| 7,810,552 | B2 | 10/2010 | Slaughter |
| 7,866,372 | B2 | 1/2011 | Slaughter |
| 7,911,793 | B2 | 3/2011 | Attlesey |
| 8,359,744 | B2 | 1/2013 | Hislop et al. |
| 9,107,293 | B2 | 8/2015 | Fitz-Patrick et al. |
| 2005/0263273 | A1 | 12/2005 | Crumly |
| 2007/0119572 | A1* | 5/2007 | Weber .................. F28D 15/0266 |
| | | | 165/80.4 |
| 2007/0256957 | A1 | 11/2007 | Herrmann et al. |
| 2008/0007913 | A1 | 1/2008 | Sullivan et al. |
| 2008/0018212 | A1 | 1/2008 | Spearing et al. |
| 2009/0219692 | A1 | 9/2009 | Wavering et al. |
| 2009/0296345 | A1 | 12/2009 | Nguyen et al. |
| 2009/0321052 | A1 | 12/2009 | Yoshioka et al. |
| 2011/0114289 | A1* | 5/2011 | Altman .................. F28F 3/12 |
| | | | 165/80.4 |
| 2011/0267776 | A1 | 11/2011 | Porreca et al. |
| 2012/0193138 | A1* | 8/2012 | Jones .................. H05K 7/202 |
| | | | 174/547 |
| 2012/0295124 | A1* | 11/2012 | Schuster ............... B22F 3/1055 |
| | | | 428/546 |
| 2013/0233526 | A1* | 9/2013 | Hislop .................. B22F 3/1055 |
| | | | 165/168 |
| 2014/0190667 | A1* | 7/2014 | McGlen ................ F28D 15/046 |
| | | | 165/104.26 |

FOREIGN PATENT DOCUMENTS

| | | |
|---|---|---|
| DE | 10-2011-086786 B3 | 3/2013 |
| EP | 1047294 A1 | 10/2000 |
| WO | WO 2013/163398 A1 | 10/2013 |

OTHER PUBLICATIONS

Written Opinion of International Searching Authority dated Nov. 1, 2013 in connection with International Patent Application No. PCT/US2013/030234; 7 pages.
International Search Report dated Sep. 8, 2015 in connection with International Patent Application No. PCT/US2015/025908; 5 pages.
Written Opinion of International Searching Authority dated Sep. 8, 2015 in connection with International Patent Application No. PCT/US2015/025908; 7 pages.
"Liquid Cooled Electronics Enclosures"; Parker Hannifin Corporation Advanced Cooling Systems; Nov. 2007 Edition; 10 pages.

* cited by examiner

MONOLITHIC MULTI-MODULE ELECTRONICS CHASSIS WITH MULTI-PLANAR EMBEDDED FLUID COOLING CHANNELS

TECHNICAL FIELD

The present disclosure is directed in general to electronics housings and more specifically to a monolithic multi-module electronics chassis with multi-planar embedded fluid cooling channels.

BACKGROUND OF THE DISCLOSURE

Electronics chassis for high power electronics are typically built using vacuum-brazed "cold walls" to form the cooling plates. Because of the special manufacturing processes involved, such chassis can require a long lead time (e.g., greater than six months) for manufacturing and implementation. In addition, such chassis are typically assembled with a large number of fasteners, adapter plates, and fittings. These characteristics may have significant impact on chassis cost, particularly for low volume manufacturing or prototyping, and on the lead time to build a new chassis, even for similar/high reuse design. This also can make it challenging to rapidly reconfigure an existing chassis for new missions or systems requirements.

SUMMARY OF THE DISCLOSURE

To address one or more of the above-deficiencies of the prior art, one embodiment described in this disclosure provides a cooling system for cooling a heat source. The cooling system includes a monolithic structure having a plurality of embedded cooling channels arranged in a multi-planar arrangement, the embedded cooling channels configured to carry a cooling fluid to a plurality of locations throughout the monolithic structure, the cooling fluid configured to absorb heat transferred from a heat source associated with the monolithic structure. The monolithic structure is formed integrally with the embedded cooling channels using an additive manufacturing process.

Another embodiment in this disclosure provides an electronics chassis configured to house and cool a plurality of heat generating electronics. The electronics chassis includes at least one cold wall having a plurality of mounting rails and a plurality of embedded cooling channels arranged in a multi-planar arrangement, the embedded cooling channels configured to carry a cooling fluid to a plurality of locations proximate to the mounting rails, the cooling fluid configured to absorb heat transferred from a heat generating electronic source mounted to at least one of the mounting rails. The at least one cold wall is formed integrally with the embedded cooling channels using an additive manufacturing process.

A further embodiment in this disclosure provides a method for manufacturing a cooling system for cooling a heat source. The method includes forming a monolithic structure and a plurality of embedded cooling channels integrally using an additive manufacturing process. The embedded cooling channels are arranged in a multi-planar arrangement and configured to carry a cooling fluid to a plurality of locations throughout the monolithic structure, the cooling fluid configured to absorb heat transferred from a heat source associated with the monolithic structure.

Although specific advantages have been enumerated above, various embodiments may include some, none, or all of the enumerated advantages. Additionally, other technical advantages may become readily apparent to one of ordinary skill in the art after review of the following figures and description.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1A:
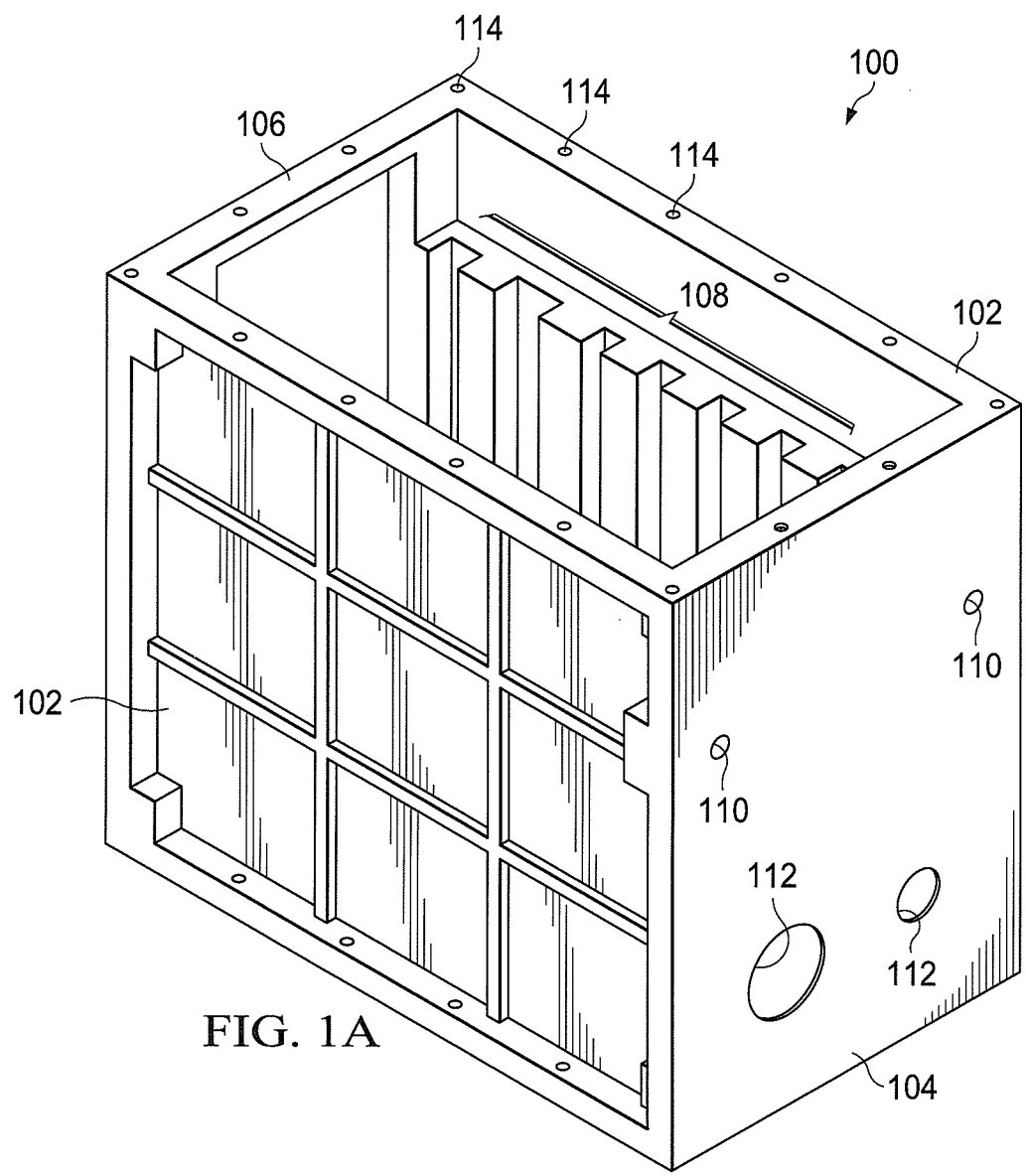
FIGS. 1A and 1B illustrate different perspective views of an example monolithic chassis, according to this disclosure.

FIGS. 1A through 5C, described below, and the various embodiments used to describe the principles of the present disclosure in this patent document are by way of illustration only and should not be construed in any way to limit the scope of the disclosure. Those skilled in the art will understand that the principles of the present disclosure may be implemented in any type of suitably arranged device or system.

Electronics chassis for high power electronics are typically built using vacuum-brazed planar "cold walls" that form a hermetic flow through planar metal plates with internal channels. These cooling plates are then generally assembled to ends of the chassis and a similar plate that forms the bottom of the chassis. The finished assembly is a substantially rectangular box shape with cooling cold walls as the top and bottom structures, and mechanical end plates.

Designs for such chassis are generally limited to traditional subtractive manufacturing structures (e.g., structures formed by milling, drilling, and the like) and generally planar features. Because of the special manufacturing processes involved, such chassis can require a long lead time (e.g., greater than six months) for manufacturing and implementation. In addition, such chassis are typically assembled with a large number of fasteners, adapter plates, and fittings. These characteristics may have significant impact on chassis cost, particularly for low volume manufacturing or prototyping, and on the lead time to build a new chassis, even for similar/high reuse design. Also, quality issues can result from the large number of plates, gaskets, and fittings. For example, there are significant opportunities for leaks at the fluid interfaces.

The limitations of vacuum-brazed cold wall manufacturing can also make it challenging to rapidly reconfigure an existing chassis for new missions or systems requirements. Scaling and reconfiguration impose considerable non-recurring expense (NRE) and lead time. This may be unacceptable for present and future defense systems that require rapid reconfiguration in order to adapt rapidly to changing threats.

To address these issues, embodiments of this disclosure provide a monolithic chassis that is formed using any one or more of a plurality of metal laser assisted additive manufacturing processes. Such processes may include Selective Laser Melting (SLM). As a specific example, Selective Laser Melting may be performed using processes such as those with the trade name of Direct Metal Laser Sintering (DMLS). As used herein, "monolithic" indicates that the chassis is one piece that is form integrally with few or no seams, joints, or attachments. During the SLM or DMLS process, fluid channels are formed and embedded in the chassis with few or no seals or seams, and can follow virtually any three dimensional (3D) path through the chassis. Thus, complex thermal structures are available in three dimensions. The fluid channels can be reliably brought directly to the module/chassis interface, thereby providing improved heat transfer characteristics.

The embodiments disclosed herein drastically reduce the lead time for providing a fluid flow-thru chassis, by using additive manufacturing techniques in place of long lead time vacuum brazing. Additionally, the disclosed embodiments significantly reduce the part count of the chassis by eliminating fasteners and fittings in a monolithic structure. This can considerably reduce quality issues, such as leakages at fluid interfaces. Furthermore, the disclosed embodiments provide for complex heat transfer shapes included in the fluid channels that would not be achievable with other manufacturing methods.

It will be understood that embodiments of this disclosure may include any one, more than one, or all of the features described herein. In addition, embodiments of this disclosure may additionally or alternatively include other features not listed herein.

Figure 1B:
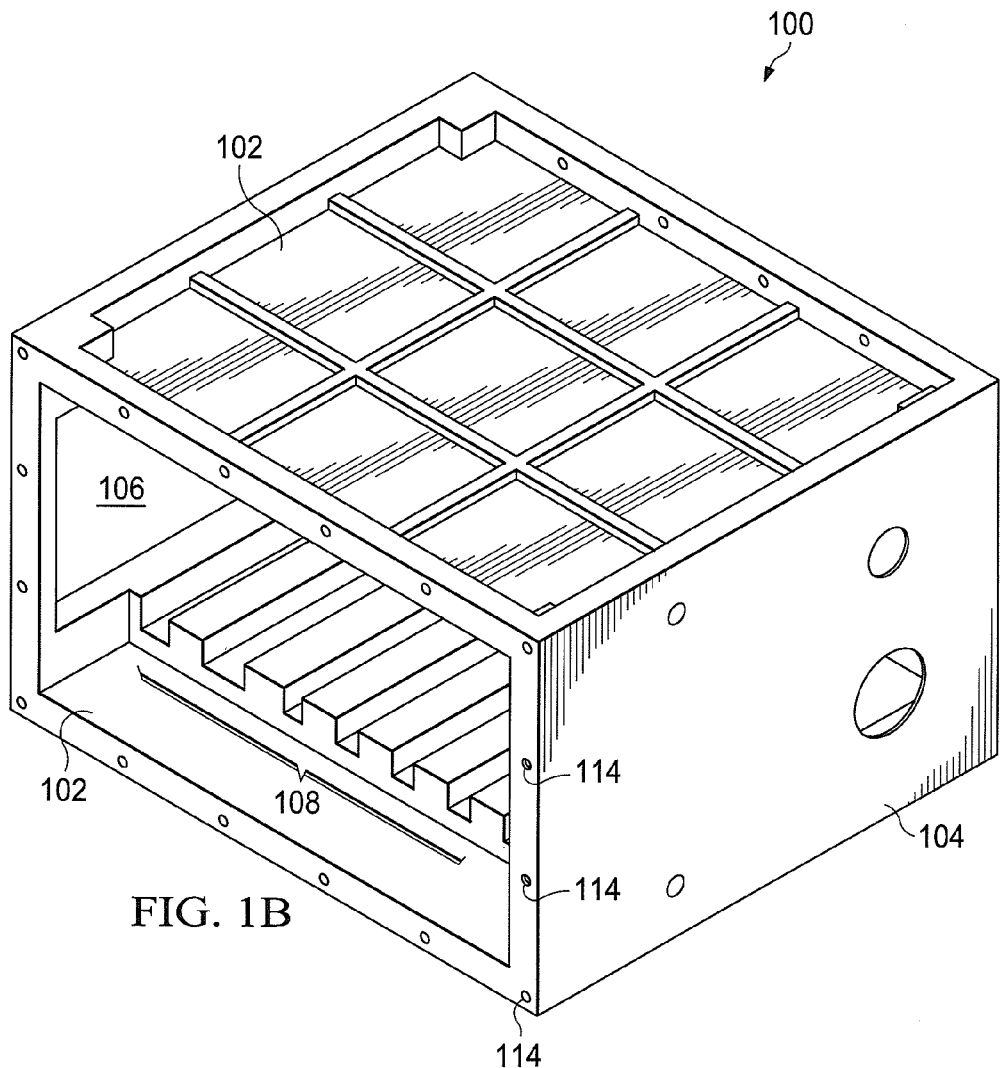

FIGS. 1A and 1B illustrate different perspective views of an example monolithic chassis, according to this disclosure. The embodiment of the chassis 100 illustrated in FIGS. 1A and 1B is for illustration only. Other embodiments could be used without departing from the scope of this disclosure.

As shown in FIGS. 1A and 1B, the chassis 100 includes a plurality of walls 102, a first end 104, and a second end 106. Each wall 102 includes a plurality of mounting rails 108. The first end 104 includes one or more interfaces 110 for the cooling fluid and one or more openings 112 for other interfaces. A plurality of mounting points 114 are found along edges of the walls 102 and ends 104, 106.

The walls 102 are cold walls that are embedded with three dimensional channels (not shown) that are formed integrally with the chassis 100. In particular, the channels are formed to be within, or in close proximity to, the card rails 108. Each mounting rail 108 is configured to receive and secure an electronic component. While the chassis 100 is in use and operating in a cooling configuration, cooling fluid passes through the channels and receives heat from heat-generating components, such as rail-mounted electronics. By receiving and dissipating heat away from the heat-generating components, the cooling fluid within the channels acts to cool the heat-generating components.

In traditional cold wall constructions, cooling channels are usually formed by joining together multiple flat, stamped, or otherwise shaped pieces (e.g., sheet metal) that comprise the walls of each channel. The traditional cooling channels are arranged in a linear (one dimensional) or planar (two dimensional) arrangement. Such channels necessarily include multiple components and one or more seams to form a hermetically sealed enclosure. For example, multiple pieces may be vacuum brazed together to form the sealed channel.

In contrast to such cooling channels, the channels embedded within each wall 102 are formed or "grown" monolithically with the wall 102 during the SLM or DMLS process. Also, the channels within each wall 102 can be formed in any configuration and can extend in any direction in three dimensions. This includes three dimensional curves, coils, helixes, multiple planes, combinations of these, and the like.

In the embodiment shown in FIGS. 1A and 1B, the first end 104 includes one or more interfaces 110 for the cooling fluid to enter and/or exit the chassis 100. The first end also includes one or more openings 112 for other interfaces, such as electrical connections, data connections, or any other suitable type of interface to the chassis 100 or to components mounted within the chassis 100. The mounting points 114 are configured to allow a cover to be attached to the chassis 100.

Although FIGS. 1A and 1B illustrate one example of a monolithic chassis 100, various changes may be made to FIGS. 1A and 1B. For example, cooling channels may be embedded within other components of the chassis 100, such as the ends 104, 106. Also, the interfaces 110 and openings 112 may be located in additional or alternative locations on the first end 104, the second end 106, or in any other suitable location. Further, the makeup and arrangement of the chassis 100 is for illustration only. Components could be added, omitted, combined, or placed in any other configuration according to particular needs.

Figure 2:
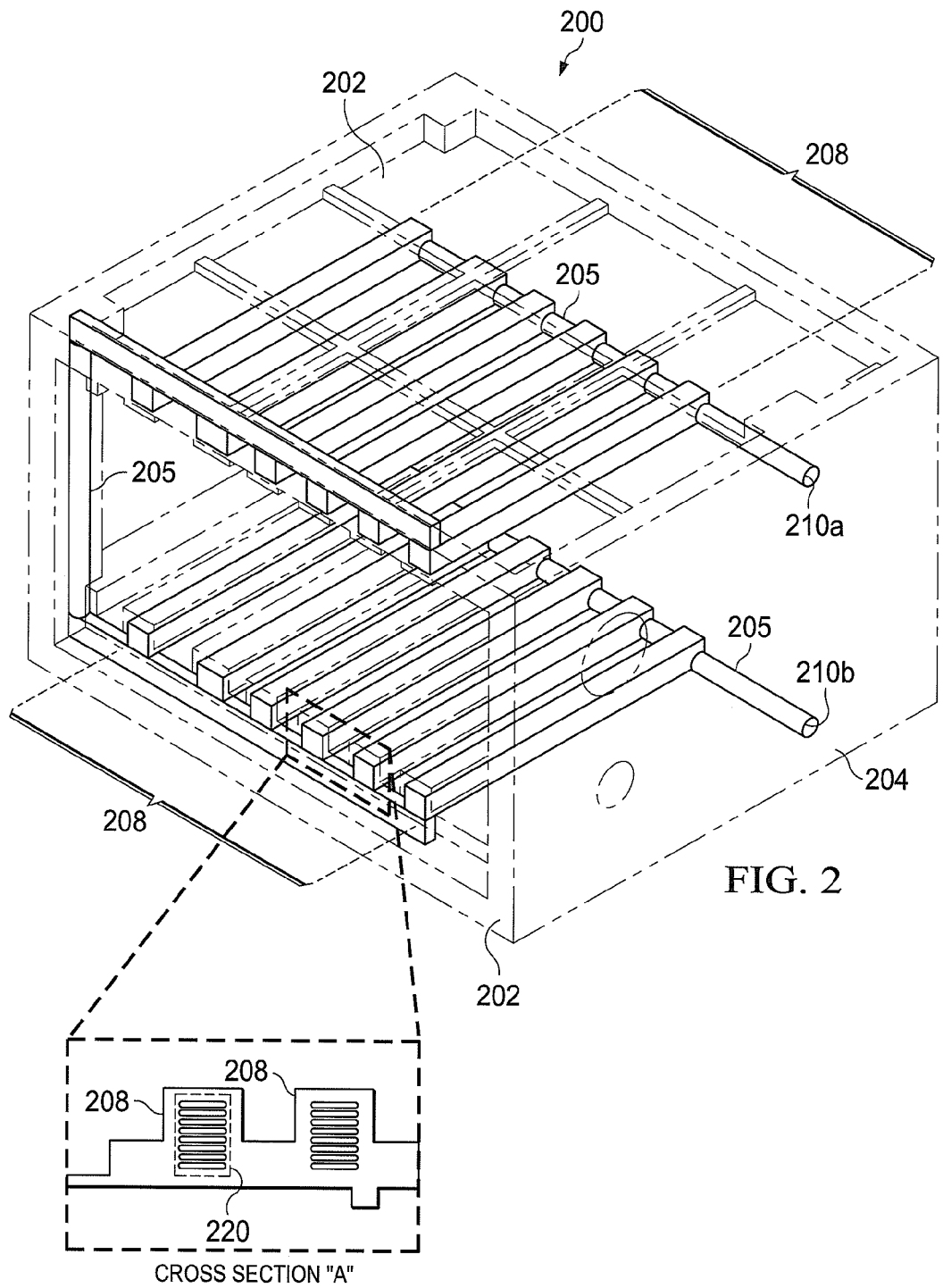
FIG. 2 illustrates a perspective view of an example monolithic chassis shown in transparent form, according to this disclosure.

FIG. 2 illustrates a perspective view of an example monolithic chassis, according to this disclosure. The chassis 200 is shown in transparent form to better illustrate some of the components of the chassis 200. The embodiment of the chassis 200 illustrated in FIG. 2 is for illustration only. Other embodiments could be used without departing from the scope of this disclosure. In some embodiments, the chassis 200 may represent the chassis 100 shown in FIGS. 1A and 1B.

As shown in FIG. 2, the chassis 200 includes a plurality of walls 202, and each wall 202 includes a plurality of mounting rails 208, similar to the chassis 100. The chassis 200 also includes an end 204 that has a plurality of interfaces 210a and 210b for the cooling fluid to enter and/or exit the chassis 200.

Like the walls 102 in the chassis 100, the walls 202 are cold walls that are embedded with cooling channels 220 that are formed integrally with the chassis 200. As shown in the cross sectional view "A", the cooling channels 220 are concentrated within, and pass along the length of, each mounting rail 208. This is because most of the cooling function occurs where each heat source (e.g., card-mounted electronics) is coupled to each mounting rail 208.

As represented by the shaded portions of FIG. 2, the cooling channels 220 are connected to the interfaces 210a and 210b and to each other by a plurality of connecting passages 205. In one aspect of operation, cooling fluid enters the chassis 200 at the interface 210a and passes through the connecting passages 205 to the cooling channels 220. The cooling fluid circulates through the cooling channels 220, thereby absorbing and removing heat from the heat-generating electronics mounted on the mounting rails 208. Then, the cooling fluid exits the chassis 200 at the interface 210b. In some embodiments, the connecting passages 205 can be considered part of the cooling channels 220, such that the integrally formed cooling channels 220 are arranged in a multi-planar arrangement and carry the cooling fluid in continuous fashion through multiple cold walls.

In the chassis 200, most or all of the cooling may occur along and within the mounting rails 208. However, in other embodiments, the structure of the chassis 200 could be different. For example, other or additional cooling channels could be positioned in other parts of the chassis 200, and the cooling could take place in those locations. Also, instead of parallel, substantially rectangular channels as shown in the cross sectional view "A", the cooling channels 220 could include different shapes, such as one or more helical structures. The additive manufacturing process for forming the monolithic chassis 200 allows for great variation in the design and location of the cooling channels and related structures.

Figure 3A:
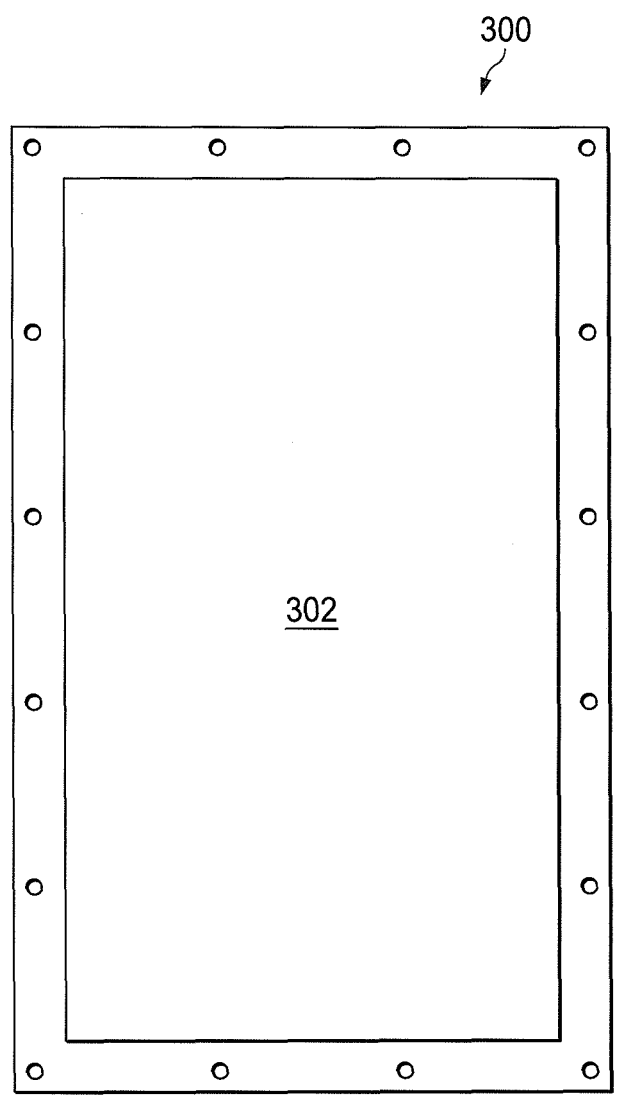
FIGS. 3A and 3B illustrate different stages of a manufacturing process of an example monolithic chassis, according to this disclosure.
Figure 3B:
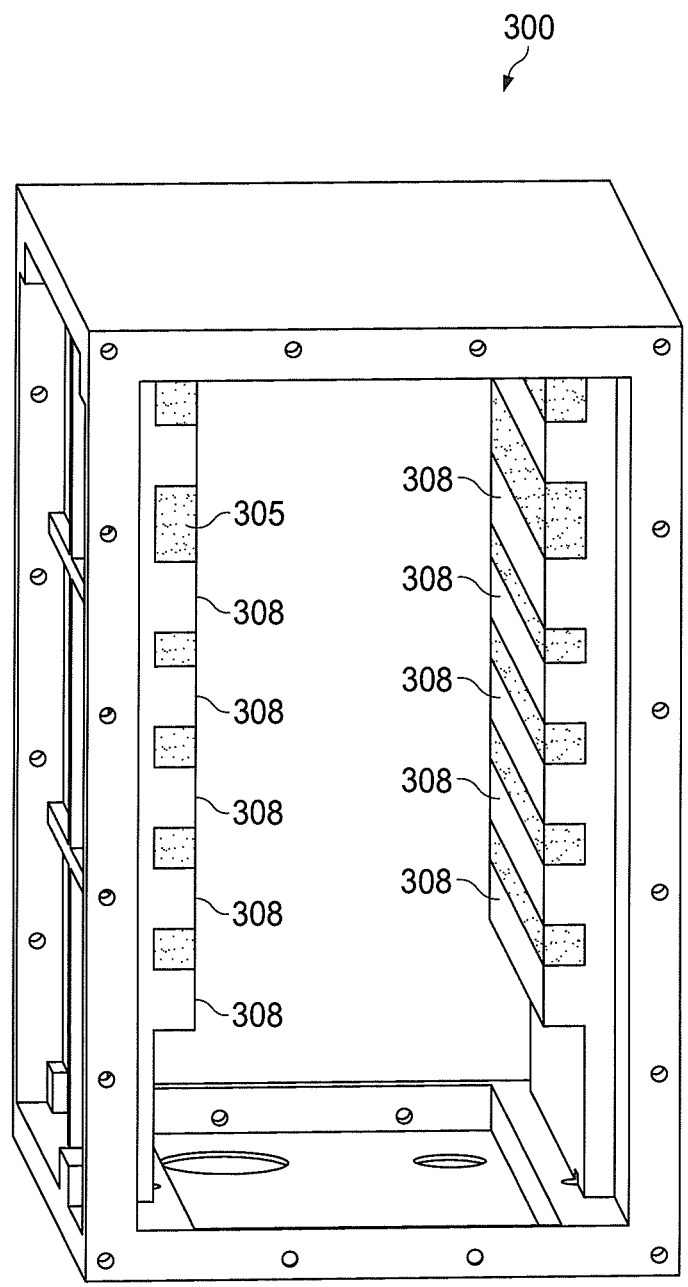

FIGS. 3A and 3B illustrate different stages of a manufacturing process of an example monolithic chassis, according to this disclosure. The embodiment of the chassis 300 illustrated in FIGS. 3A and 3B is for illustration only. Other embodiments could be used without departing from the scope of this disclosure. In some embodiments, the chassis 300 may represent the chassis 100 as shown in FIGS. 1A and 1B or the chassis 200 as shown in FIG. 2.

As shown in FIG. 3A, the chassis 300 has been formed using an additive manufacturing process, such as SLM or DMLS. At the stage shown in FIG. 3A, the chassis 300 appears as a substantially solid block. A middle portion 302 of the chassis is substantially filled in with support material. The support material is formed with the chassis 300 during the SLM or DMLS process to maintain the overall shape of the chassis 300 as the chassis 300 is being formed, and will ultimately be removed before the chassis 300 is completed. In some embodiments, depending on the shape of the chassis, such supporting material may not be needed or included in the SLM or DMLS process. After most of the support material is removed, the chassis 300 appears as shown in FIG. 3B. Some residual support material, such as the material identified with reference numeral 305, remains between adjacent mounting rails 308 of the chassis 300. In a later manufacturing step, the residual support material will also be removed, leaving mounting rails 308 that are similar in appearance to the mounting rails 108 in FIGS. 1A and 1B.

SLM is an additive metal fabrication process that is based on concepts of selective laser sintering. In SLM, a model of a three dimensional structure is developed using computer aided design (CAD) software or other software. Once developed, the design of the three dimensional structure is loaded into the SLM machine, and the structure is built layer by layer in three dimensions using a material such as metallic powder. Because SLM is an additive fabrication process that creates a three dimensional structure in very thin layers, one layer at a time, it is possible to create complex three dimensional shapes and voids within the structure. For example, although the mounting rails 308 appear in FIG. 3B to be solid, the mounting rails 308 actually include embedded cooling channels, such as the channels 220 shown in FIG. 2. Such channels are easily formed within each mounting rail 308 during the DMLS process. Other channels may also exist throughout the chassis 300, similar to those shown in FIG. 2.

A monolithic electronics chassis, such as the chassis 300, can be formed with no joining seams or mechanical seals, and accommodate integrated mounting features for multiple electronics modules. Such a chassis features a substantial reduction of fasteners due to the process of additive manufacturing. The chassis can also feature multi-planar (i.e., 3D), embedded, continuous, hermetically sealed cooling channels. As used herein, "multi-planar" indicates that each cooling channel is not merely arranged in a substantially two-dimensional or planar arrangement, but may bend, curve, or angle in any direction across multiple planes and/or in all three dimensions, and may traverse continually through multiple adjacent walls of the chassis. In some embodiments, the cooling channels may be routed directly to the electronics mounting rails with no ancillary fluidic seals due to the monolithic nature of the chassis. Such a chassis may also incorporate novel and complex fluid flow or heat transfer structures that cannot be manufactured using processes such as vacuum brazing. Some of the novel heat transfer structures are described in greater detail below.

In addition to the embedded cooling channels, the chassis 300 may include other structural features that are possible due to the SLM manufacturing process. For example, although the chassis 300 appears to be comprised of substantially solid walls (except for the embedded cooling channels, which are not seen in FIGS. 3A and 3B), the use of SLM facilitates the formation of one or more portions of the chassis 300 that are not completely solid, but instead contain a number of voids. For example, one or more walls of the chassis 300 may be formed as a lattice, web, or mesh type structure. Such a wall would still be strong enough to be structurally supportive, but would be more lightweight and require much less material than a solid wall. In some embodiments, the lattice arrangement could be definite, with regular, periodic voids. In other embodiments, the lattice arrangement could be irregular with randomly spaced voids. In general, the use of SLM allows the easy removal of any material from the design of the chassis 300 that is not needed for structural support, for the integrity of the cooling channels, or for electromagnetic interference (EMI) protection.

Figure 4:
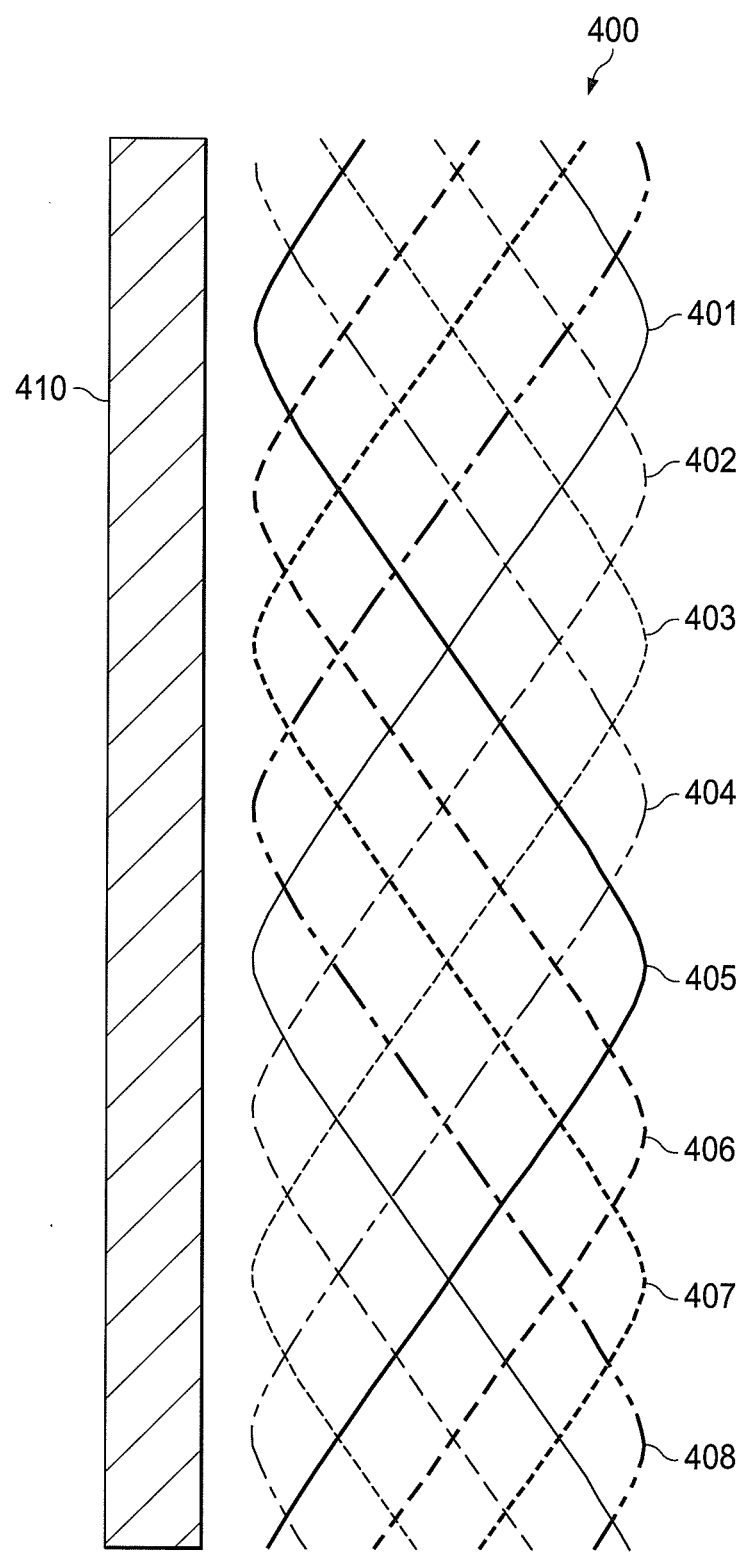
FIG. 4 illustrates an example cooling channel helix that may be embedded in a structure, according to this disclosure.

FIG. 4 illustrates an example cooling channel helix that may be embedded in a structure, according to this disclosure. The embodiment of the cooling channel helix 400 illustrated in FIG. 4 is for illustration only. Other embodiments could be used without departing from the scope of this disclosure. In some embodiments, the cooling channel helix 400 may represent, or be associated with, one or more of the cooling channels shown in FIG. 2.

As shown in FIG. 4, the cooling channel helix 400 includes a plurality of separate cooling channels 401-408 arranged in a multiple helix pattern. Although eight cooling channels are shown in FIG. 4, this is merely one example, and more or fewer channels may be used in the helix 400 depending on the implementation.

In traditional cold walls, heat from the heat source conducts into one side or area of the cold wall where the heat source makes contact. The ability of the heat to conduct to the cooling fluid is one of the key components to the overall cooling effect. This conductive ability is affected by many factors, including thermal conductivity and surface area of contact. Due to thermal conductive properties, cooling fluid flowing in channels farther away from the points of contact of the heat source has a diminished availability for cooling the heat source.

To help resolve this issue, multiple fluid channels can be arranged in a helix, such as the cooling channel helix 400. Each cooling channel 401-408 coils closer to, and further away from, the points of contact with a heat source 410. During operation, as cooling fluid flows through each channel 401-408, heat is quickly transferred to the cooling fluid near the points of contact and then moved away. In other words, cooler fluid from points in each channel further away from the heat source 410 is eventually brought closer to the heat source 410, while warmer fluid flows to the further-away points. Thus, each cooling channel 401-408 has a substantially equal opportunity to cool the heat source 410.

The cross-sectional area of each cooling channel 401-408 could be any of multiple shapes, including rectangular channels, square channels, round channels, or any other suitable shape. The number of channels and the period of rotation of each channel (i.e., the linear distance between adjacent points of contact with the heat source 410) could also vary according to implementation. In some embodiments, tighter helical periods of rotation can enhance heat transfer further by using the fluid momentum to create thinner boundary layers against the inner walls of the channels.

While FIG. 4 illustrates one example of a cooling channel helix 400, various changes may be made to FIG. 4. For example, instead of a helix, the cooling channels 401-408 could be arranged in other multi-planar and three dimensional shapes and geometries. In some embodiments, the different possible shapes and lengths of the channels, combined with the resulting increased movement of the cooling fluid, increases the advective properties of the cooling fluid.

Figure 5A:
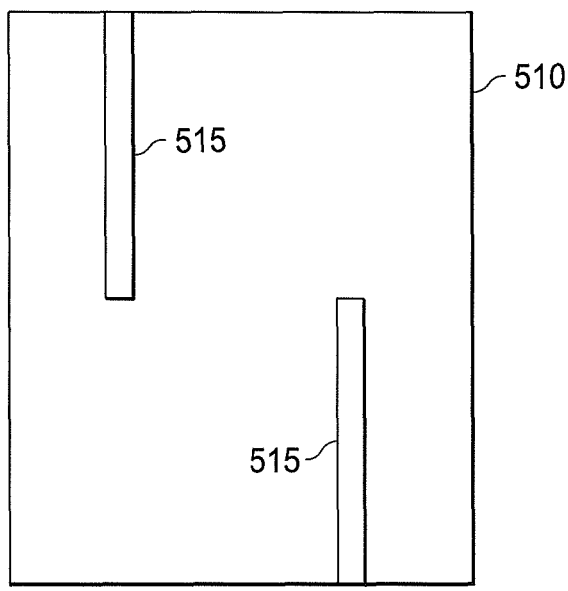
FIGS. 5A through 5C illustrate different example cooling fins for use inside a cooling channel, according to this disclosure.
Figure 5B:
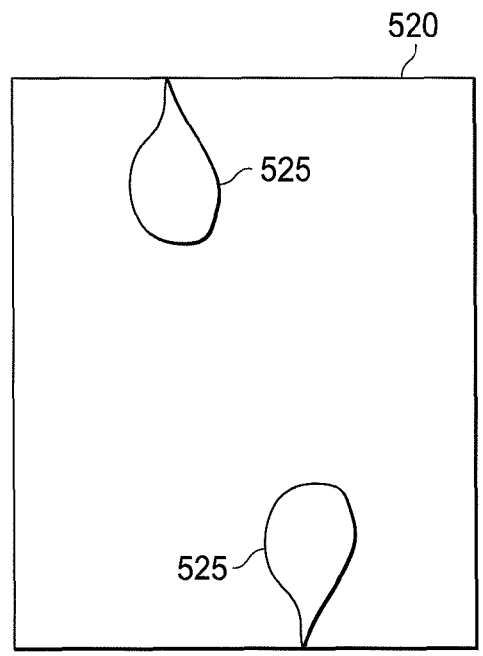
Figure 5C:
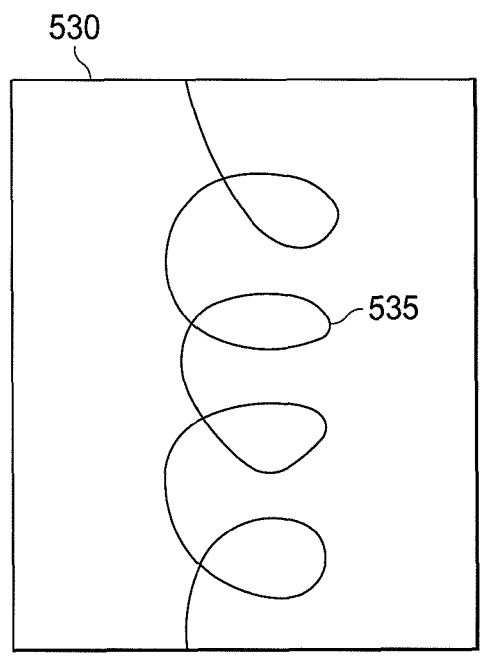

FIGS. 5A through 5C illustrate different example cooling fins for use inside a cooling channel, according to this disclosure. The embodiments of the cooling fins illustrated in FIG. 5A through 5C are for illustration only. Other embodiments could be used without departing from the scope of this disclosure. In some embodiments, the cooling fins may be incorporated into one or more of the cooling channels shown in FIGS. 2 and 4.

FIGS. 5A through 5C show cross-sectional views of cooling channels 510, 520, 530. In some embodiments, the cooling channels 510, 520, 530 may represent one or more of the cooling channels shown in FIGS. 2 and 4. Although the cooling channels 510, 520, 530 are depicted as having a rectangular cross-sectional shape, the cooling channels 510, 520, 530 could have any other suitable cross-sectional shape according to the implementation.

As shown in FIG. 5A, the cooling channel 510 includes a plurality of pin fins 515 that project from interior walls of the cooling channel 510 into the interior space of the cooling channel 510. In one aspect of operation, heat from one or more heat sources outside the cooling channel 510 is transferred into the walls of the cooling channel 510 and further conducts inwardly along the pin fins 515. As cooling fluid passes through the cooling channel 510, the cooling fluid contacts the pin fins 515, and absorbs the heat in the pin fins 515 that was transferred from the one or more heat sources located outside of the cooling channel 510.

In addition to pin fins, research indicates that elliptical or tear-drop shaped fins can enhance heat transfer while minimizing pressure loss within the cooling channel. As shown in FIG. 5B, the cooling channel 520 includes a plurality of tear drop shaped fins 525. Like the pin fins 515, the tear-drop shaped fins 525 help to transfer heat away from a heat source into the cooling fluid. However, the tear drop shaped fins 525 may minimize pressure losses in the cooling channel 520.

Although two fins are shown in the cooling channels in FIGS. 5A and 5B, the number of fins in each cooling channel may vary. Similarly, the arrangement, positioning, and distribution of the fins along the length of each cooling channel may vary according to the implementation.

FIG. 5C illustrates a different shape of fin for use in a cooling channel. As shown in FIG. 5C, the cooling channel 530 includes a pigtail fin 535 that spans an interior section of the cooling channel 530. The pigtail fin 535 is shaped substantially similar to a loosely wound coil with space between consecutive turns of the coil. The space between the turns allows the cooling fluid to pass around all points of the surface area of the pigtail fin 535. Like the pin fins 515, the pigtail fin 535 helps to transfer heat away from a heat source into the cooling fluid. Compared to the pin fins 515, the greater overall length of the pigtail fin 535 provides a greater surface area through which to transfer heat. Although one pigtail fin 535 is shown in the cooling channel 530, the number of pigtail fins in the cooling channel 530 may vary. Similarly, the arrangement, positioning, and distribution of the pigtail fins along the length of the cooling channel 530 may vary according to the implementation.

In the embodiments shown in FIGS. 5A through 5C, the various fins 515, 525, 535 project into the cooling fluid to provide more surface area for the fluid to move around and more opportunity for the fluid boundary layer to become interrupted, which improves heat transfer to the cooling fluid. In other embodiments, fins may additionally or alternatively project outwardly from the cooling channel into the volume surrounding the heat source.

In most manufacturing processes, heat transfer features similar to those described above must be cast, creating limitations on aspect ratio, draft angle, and fin packing density. In some other manufacturing processes, such as ultrasonic methods or fusion bonding, some of the enhanced heat transfer features shown in FIGS. 5A through 5C may be impossible to form. The additive manufacturing process disclosed herein removes these barriers.

The embodiments disclosed herein provide a number of advantages over other cooling structures. For example, in some embodiments, the part count is greatly reduced, resulting in reduced assembly touch labor and a reduced logistics trail. Some embodiments exhibit enhanced electromagnetic interference (EMI) performance due to elimination of part interfaces. Pressure testing has demonstrated that the cooling channels of this disclosure exhibit substantially complete hermeticity (i.e., no leaks) at pressures typically associated with high performance thermally controlled electronics chassis.

In the embodiments disclosed herein, the heat source is identified as electronics components. However, this disclosure is not limited thereto. In some embodiments, the heat source may include other heat sources. For example, the heat source may be due to environmental heating loads, such as from solar heating, aerodynamic heating, and the like. The disclosed cooling channels and structures are applicable for removal of heat in any such heating environments.

Additional or alternative modifications have been contemplated, including incorporation of gradient alloys or multiple materials (e.g., plastic components in addition to metal alloys) in the disclosed additive manufacturing process.

It may be advantageous to set forth definitions of certain words and phrases used throughout this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

To aid the Patent Office, and any readers of any patent issued on this application in interpreting the claims appended hereto, applicants wish to note that they do not intend any of the appended claims or claim elements to invoke paragraph 6 of 35 U.S.C. Section 112 as it exists on the date of filing hereof unless the words "means for" or "step for" are explicitly used in the particular claim.

What is claimed is:

1. A cooling system comprising:
    a plurality of walls having a plurality of mounting rails and a plurality of embedded cooling channels arranged in a multi-planar arrangement, at least a portion of the embedded cooling channels embedded in one or more of the mounting rails, the embedded cooling channels configured to carry a cooling fluid to a plurality of locations proximate to the mounting rails, the cooling fluid configured to absorb heat transferred from a heat source mounted to at least one of the mounting rails;
    wherein at least one interface is disposed in at least one of the walls, the at least one interface configured to allow the cooling fluid to enter or exit the cooling system;
    wherein at least some of the embedded cooling channels form a multiple helix configured to carry the cooling fluid towards and away from the heat source repeatedly in a cyclical manner; and
    wherein the walls, the mounting rails, and the embedded cooling channels are formed integrally and without seams using an additive manufacturing process.

2. The cooling system of claim 1, wherein the walls, the mounting rails, and the embedded cooling channels are formed integrally using a Selective Laser Melting (SLM) process.

3. The cooling system of claim 1, wherein the embedded cooling channels are configured to carry the cooling fluid in a continuous fashion through at least two of the walls of the cooling system.

4. The cooling system of claim 1, wherein each mounting rail has a length from a first end to a second end, and at least a portion of the embedded cooling channels embedded in the one or more mounting rails extends substantially along the length of the one or more mounting rails.

5. The cooling system of claim 1, wherein the cooling system comprises at least one portion that is formed as a lattice, web, or mesh in the additive manufacturing process.

6. The cooling system of claim 1, wherein each cooling channel comprises a plurality of channel walls that define an interior space of the cooling channel, wherein a plurality of heat transfer structures project from at least one of the channel walls into the interior space of the cooling channel.

7. The cooling system of claim 6, wherein the plurality of heat transfer structures comprises at least one of: a pin shaped fin, a pigtail shaped fin, or a tear drop shaped fin.

8. An electronics chassis configured to house and cool a plurality of heat generating electronics, the electronics chassis comprising:
    at least one cold wall having a plurality of mounting rails and a plurality of embedded cooling channels arranged in a multi-planar arrangement, at least a portion of the embedded cooling channels embedded in one or more of the mounting rails, the embedded cooling channels configured to carry a cooling fluid to a plurality of locations proximate to the mounting rails, the cooling fluid configured to absorb heat transferred from a heat generating electronic source mounted to at least one of the mounting rails,
    wherein at least some of the embedded cooling channels form a multiple helix configured to carry the cooling fluid towards and away from the heat generating electronic source repeatedly in a cyclical manner, and
    wherein the at least one cold wall, the mounting rails, and the embedded cooling channels are formed integrally and without seams using an additive manufacturing process.

9. The electronics chassis of claim 8, wherein the at least one cold wall, the mounting rails, and the embedded cooling channels are formed using a Selective Laser Melting (SLM) process.

10. The electronics chassis of claim 8, wherein the at least one cold wall comprises multiple cold walls, and the embedded cooling channels are configured to carry the cooling fluid in a continuous fashion through at least two of the cold walls of the electronics chassis.

11. The electronics chassis of claim 8, wherein each mounting rail has a length from a first end to a second end, and at least a portion of the embedded cooling channels embedded in the one or more mounting rails extends substantially along the length of the one or more mounting rails.

12. The electronics chassis of claim 8, wherein the electronics chassis comprises at least one portion that is formed as a lattice, web, or mesh in the additive manufacturing process.

13. The electronics chassis of claim 8, wherein each cooling channel comprises a plurality of walls that define an interior space of the cooling channel, wherein a plurality of heat transfer structures project from at least one of the walls into the interior space of the cooling channel.

14. The electronics chassis of claim 13, wherein the plurality of heat transfer structures comprises at least one of: a pin shaped fin, a pigtail shaped fin, or a tear drop shaped fin.

15. A method comprising:
    forming an electronics chassis comprising at least one cold wall having a plurality of mounting rails and a plurality of cooling channels formed integrally and without seams using an additive manufacturing process, at least a portion of the cooling channels embedded in one or more of the mounting rails;
    wherein the embedded cooling channels are arranged in a multi-planar arrangement and configured to carry a cooling fluid to a plurality of locations proximate to the mounting rails, the cooling fluid configured to absorb heat transferred from a heat generating source mounted to at least one of the mounting rails; and
    wherein at least some of the embedded cooling channels form a multiple helix configured to carry the cooling fluid towards and away from the heat generating source repeatedly in a cyclical manner.

16. The method of claim 15, wherein the at least one cold wall, the mounting rails, and the embedded cooling channels are formed integrally using a Selective Laser Melting (SLM) process.

17. The method of claim 15, wherein the at least one cold wall comprises multiple cold walls, and wherein the embedded cooling channels are configured to carry the cooling fluid in continuous fashion through at least two walls of the electronics chassis.

18. The method of claim 15, wherein each mounting rail has a length from a first end to a second end, and at least a portion of the embedded cooling channels embedded in the one or more mounting rails extends substantially along the length of the one or more mounting rails.

19. The method of claim 15, wherein the electronics chassis comprises at least one portion that is formed as a lattice, web, or mesh in the additive manufacturing process.

20. The method of claim 15, wherein each cooling channel comprises a plurality of walls that define an interior space of the cooling channel, wherein a plurality of heat transfer structures project from at least one of the walls into the interior space of the cooling channel.

21. The method of claim 20, wherein the plurality of heat transfer structures comprises at least one of: a pin shaped fin, a pigtail shaped fin, or a tear drop shaped fin.

* * * * *